United States Patent [19]
Sato et al.

[11] Patent Number: 4,731,592
[45] Date of Patent: Mar. 15, 1988

[54] VOLTAGE CONTROLLABLE OSCILLATOR

[75] Inventors: Akiro Sato; Jun Ono, both of Kanagawa; Kenichiro Kumamoto; Koichi Ohya, both of Tokyo, all of Japan

[73] Assignee: Sony Corporation, Tokyo, Japan

[21] Appl. No.: 942,355

[22] Filed: Dec. 16, 1986

[30] Foreign Application Priority Data

Dec. 16, 1985 [JP] Japan .................................. 60-282326

[51] Int. Cl.$^4$ ............................................. H03B 5/12
[52] U.S. Cl. ............................. 331/108 C; 331/117 R; 331/177 V; 331/179; 331/181
[58] Field of Search ........... 331/108 C, 108 D, 117 R, 331/117 FE, 177 V, 179, 181

[56] References Cited

U.S. PATENT DOCUMENTS 4,484,157 11/1984 Halle et al. .................. 331/177 V X
4,494,081 1/1985 Lea et al. ..................... 331/177 V X
4,500,854 2/1985 Meyer .......................... 331/177 V X

FOREIGN PATENT DOCUMENTS

1591097 10/1970 Fed. Rep. of Germany ... 331/177 V

Primary Examiner—Eugene R. LaRoche
Assistant Examiner—David Mis
Attorney, Agent, or Firm—Lewis H. Eslinger

[57] ABSTRACT

An integrated voltage controllable oscillator having a transistor for oscillation is further provided with a resonance circuit externally connected to two electrodes of the transistor for oscillation and including a variable capacitance element adapted to vary a resonance frequency of the resonance circuit, and a high impedance element connected between the variable capacitance element and the ground in a circuit adapted to supply a control voltage to the variable capacitance element.

7 Claims, 11 Drawing Figures

VOLTAGE CONTROLLABLE OSCILLATOR

BACKGROUND OF THE INVENTION

1. Field of the Invention

This invention relates generally to integrated voltage controllable oscillators, and more particularly to such an integrated circuit (IC) oscillator suitable for use when a wide range of frequencies is required, for example, as a local oscillator for cable television (CATV) electronic tuners.

2. Description of the Prior Art

Figure 1:
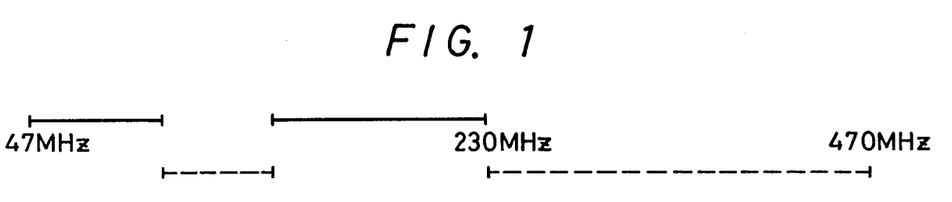
FIG. 1 shows the allocation of frequencies in the VHF band in West Germany.

With recent popularization of cable television, the receivable frequency band of electronic tuners has been widened, so as to accommodate this tendency. For example, in Europe, and specifically in West Germany, the allocated frequency band for CATV in the VHF band is as shown in FIG. 1. It will be apparent from FIG. 1, that a CATV tuner for Europe (West Germany) is required to receive frequencies in a band between 47 MHz and 470 MHz, and the circuit arrangement of a tuner therefor becomes extremely complicated. To permit such complicated circuit to be housed in a small package and to facilitate the production thereof, there has been a strong tendency to integrate a mixer, a local oscillator, and an IF amplifier of the CATV tuner in one chip (IC).

Figure 2:
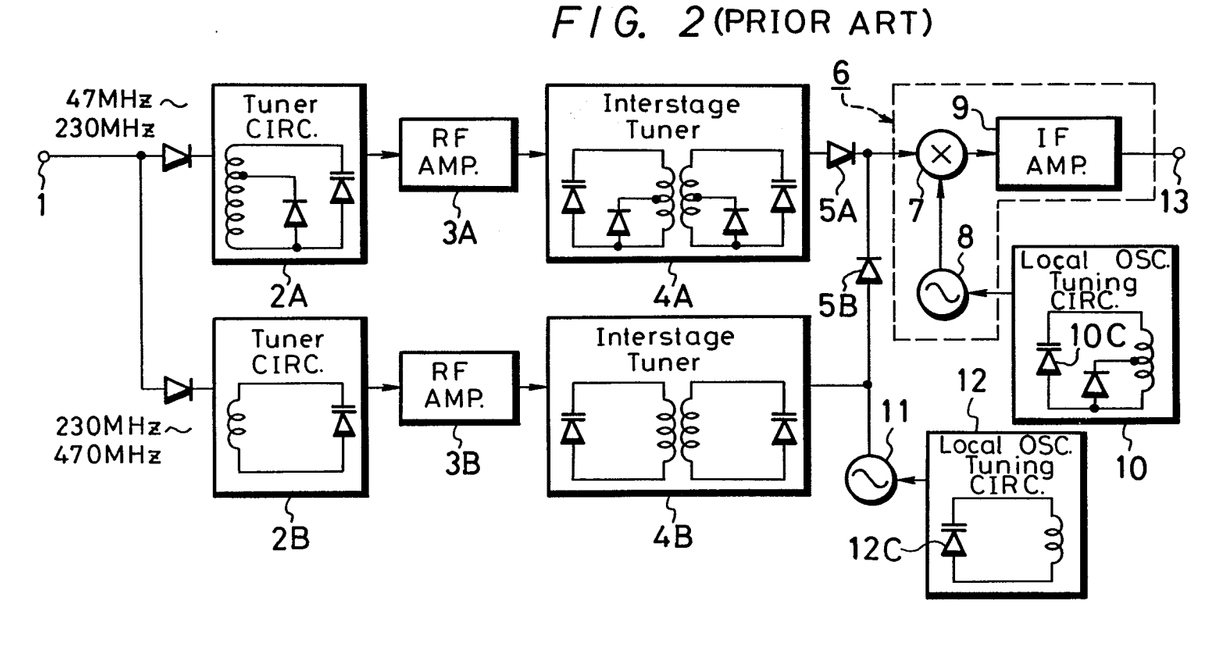
FIG. 2 is a block diagram showing an example of a prior art electronic tuner.

For example, as shown on FIG. 2, a conventional electronic tuner using such an IC includes an input terminal 1 for receiving an RF signal from an antenna or cable terminal (not shown), input tuner circuits 2A and 2B, RF amplifiers 3A and 3B, interstage tuner circuits 4A and 4B, and diodes 5A and 5B for switching operation. Further, an IC is generally identified at 6 and has a mixer 7, a local oscillator 8 for the frequency band between 47 MHz and 230 MHz, and an IF amplifier 9.

A local oscillating tuner circuit 10 is externally connected to IC 6 and provides an output signal which is varied by a selection signal supplied to a variable capacitance diode 10c included in circuit 10 to obtain a local oscillation frequency corresponding to a signal in the band been 47 MHz and 230 MHz. Another local oscillator 11 is used when a frequency in a band between 230 MHz and 470 MHz is received. The oscillation frequency generated by local oscillator 11 is varied by a selection signal supplied to a variable capacitance diode 12c in another local oscillating tuner circuit 12.

In the circuit construction described above, when the RF signal provided to input terminal 1 has a frequency between 47 MHz and 230 MHz, diode 5A is turned ON while diode 5B is turned OFF. Then, the input RF signal is processed successively in input tuner circuit 2A, RF amplifier 3A, and interstage tuner circuit 4A, and finally supplied to mixer 7 in IC 6 through diode 5A to be multiplied by the local signal from local oscillator circuit 8, whereby a broadcast wave for a desired channel is converted into an IF signal which is delivered to an output terminal 13 through IF amplifier 9.

On the other hand, when an RF signal in a band between 230 MHz and 470 MHz is received, diode 5A is turned OFF while diode 5B is turned ON. In that case, the received RF signal is processed successively by input tuner circuit 2B, RF amplifier 3B, and interstage tuner circuit 4B, prior to being supplied to mixer 7 in IC 6 through diode 5B. At this time, local oscillator 8 in IC 6 is inoperative, but an output signal from external local oscillator 11 is supplied to mixer 7 in IC 6 through diode 5B as a local oscillating signal. In other words, external oscillator 11 is employed in place of local oscillator 8 integrated in the IC 6 for the reception of RF signals in the band between 230 MHz and 470 MHz.

In the above-described conventional electronic tuner, since the local oscillated signal from oscillator 11 is also applied to the input side of mixer 7, the latter has to be a mixer of the so-called single-ended type. In other words, a mixer of the balanced type cannot be employed for the kind of circuit shown on FIG. 2.

Figure 3:
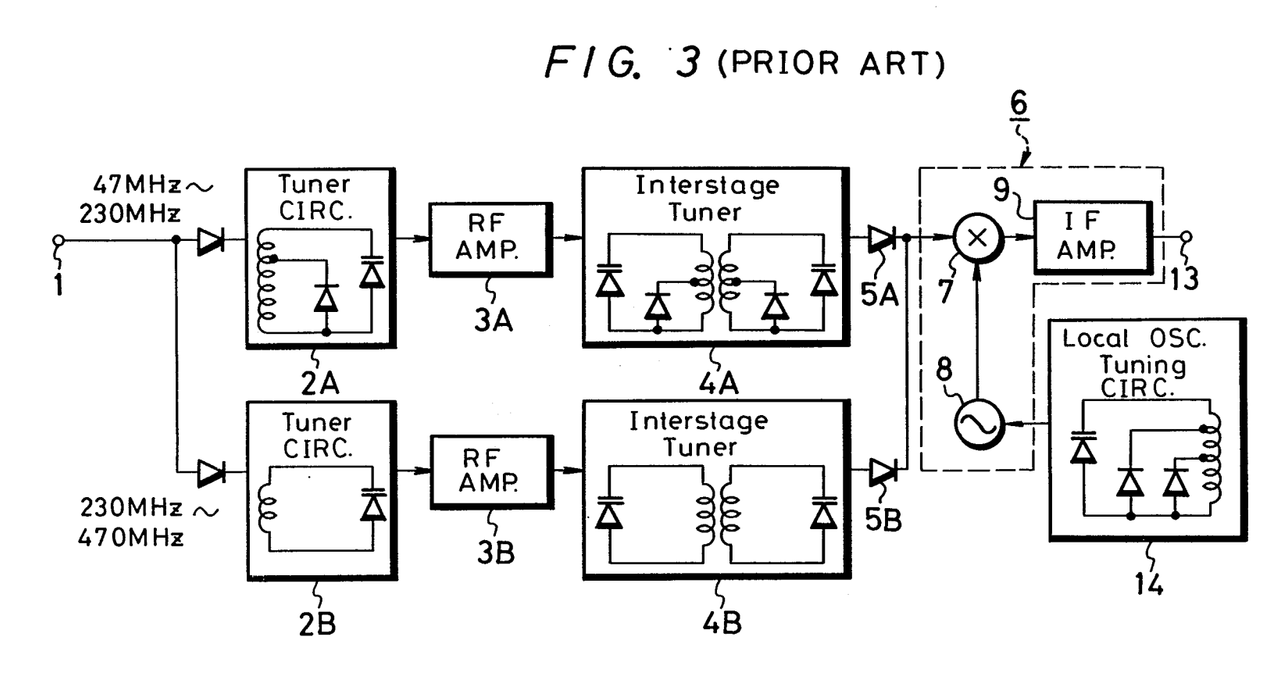
FIG. 3 is a block diagram showing another example of a prior art electronic tuner.

Recently, since the regulations against interference affecting performance have been tightened by law, it has become necessary to use a mixer of the double-balanced type as the mixer in the IC of an electronic tuner. In such case, the local oscillator 8 integrated in the IC 6 must be used over the entire frequency band. Therefore, it is necessary to provide, as shown in FIG. 3, a local oscillator tuner circuit 14 connected to the local oscillator 8 in IC 6 and making possible use of local oscillator 8 as a three-band change-over oscillator.

Figure 4:
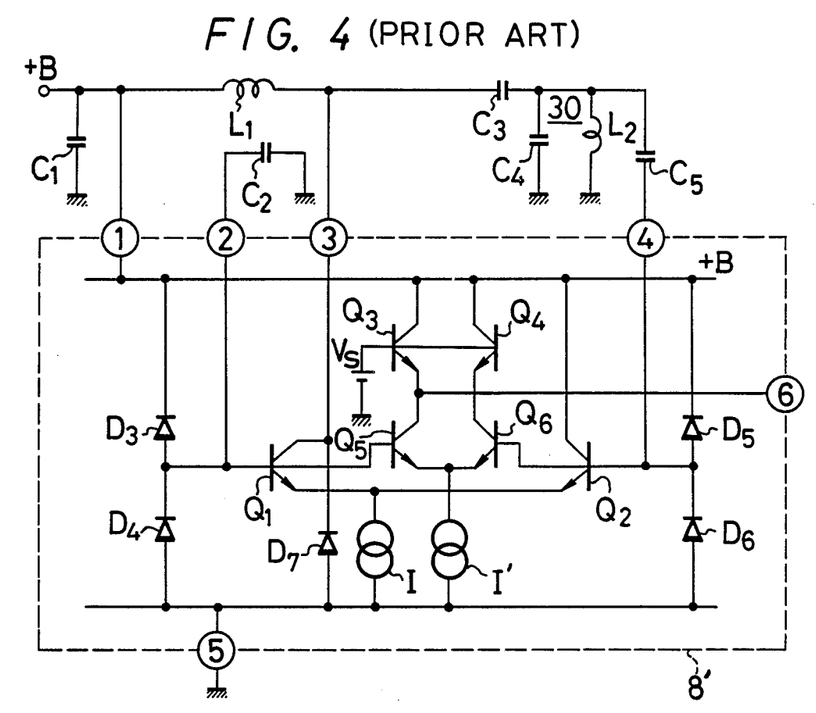
FIG. 4 is a circuit diagram showing an example of a conventional integrated fixed frequency oscillator circuit.

FIG. 4 shows an example of a circuit of a conventional electronic tuner wherein an integrated local oscillating circuit or IC 8' is used as a fixed frequency oscillator. This is the most basic circuit for relatively easily obtaining stable oscillations.

In FIG. 4, there are provided inside the IC 8' a transistor $Q_1$ for oscillation and a transistor $Q_2$ for feedback amplification. The base and collector of transistor $Q_1$ are connected to pins 2 and 3, respectively, of IC 8'. The base and collector of transistor $Q_2$ are respectively connected to a pin 4 of IC 8' and to a common line to which is connected a pin 1 of IC 8'. The pin 1 is supplied with a power source voltage $+B$. The emitters of transistors $Q_1$ and $Q_2$ are connected with each other, and the junction point therebetween is connected, through a current source I, to a common line to which is connected a grounded pin 5 of IC 8'. An output circuit comprising transistors $Q_3, Q_4, Q_5$ and $Q_6$, a voltage source $V_s$ and a current source I' connected as shown is provided in IC 8', to derive an output oscillation at a pin 6 which may be connected to mixer 7 in FIG. 2. Additional electronic parts are externally connected to IC 8', as will be described below, so as to provide a Colpitts-type oscillator.

More particularly, as shown on FIG. 4, a bypass-capacitor $C_1$ connects the power source line $+B$ to ground, and a ground capacitor $C_2$ is connected between ground and the pin 2 of IC 8' to which is connected the base of the transistor $Q_1$. A choke winding $L_1$ for the power source voltage $+B$ is connected between the power source output terminal (not shown) and pin 3 of the IC 8', that is, the collector of oscillation transistor $Q_1$. Between pin 3, that is, the collector of transistor $Q_1$ and pin 4, that is, the base of transistor $Q_2$, there is connected a series circuit of a capacitor $C_3$ for blocking direct current components and a capacitor $C_5$ for feedback so as to constitute a feedback loop. A parallel resonance circuit 30 constituted by a resonance capacitor $C_4$ and a resonance winding $L_2$ is connected between the junction point between the capacitors $C_3$ and $C_5$ and the ground.

It will be seen that the oscillator circuit shown in FIG. 4 constitutes a base-grounded Colpitts-type oscillator in which the base of transistor $Q_1$ for oscillation is grounded, the collector thereof is connected with the tuner circuit, and the oscillating power therefrom is supplied through feedback capacitor $C_5$ to the base of transistor $Q_2$ which has its emitter-follower output fed back to transistor $Q_1$.

Figure 5:
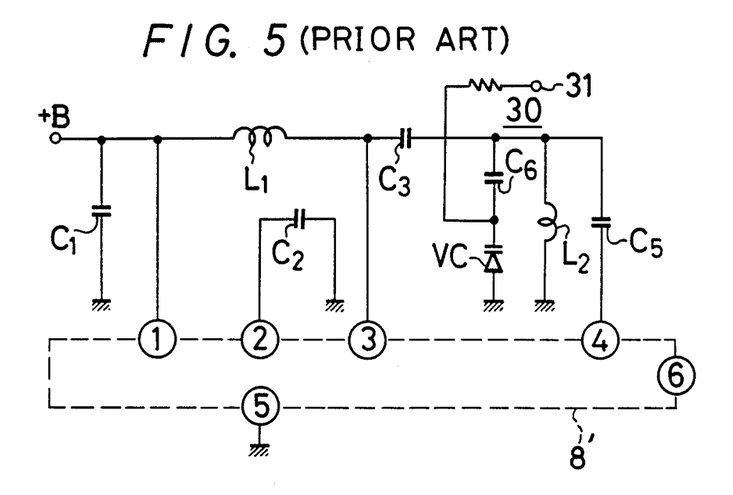
FIGS. 5 and 6 are circuit diagrams respectively showing examples of conventional integrated variable frequency oscillator circuits.

FIG. 5 shows a variable frequency oscillator which is generally similar to the circuit of FIG. 4, but wherein a series circuit composed of a capacitor $C_6$ and a variable capacitance diode VC for adjusting the range of the oscillation frequency is provided in a parallel resonance circuit 30' in place of resonance capacitor $C_4$ in resonance circuit 30 of the fixed frequency oscillator of FIG. 4.

In this case, that is, in the circuit of FIG. 5, a voltage supplied to variable capacitance diode VC is a selection voltage for the tuner which is fed to the junction point between capacitor $C_6$ and variable capacitance diode VC through a terminal 31. The selection voltage changes the capacitance of variable capacitance diode VC, to thereby vary the oscillation frequency.

Figure 6:
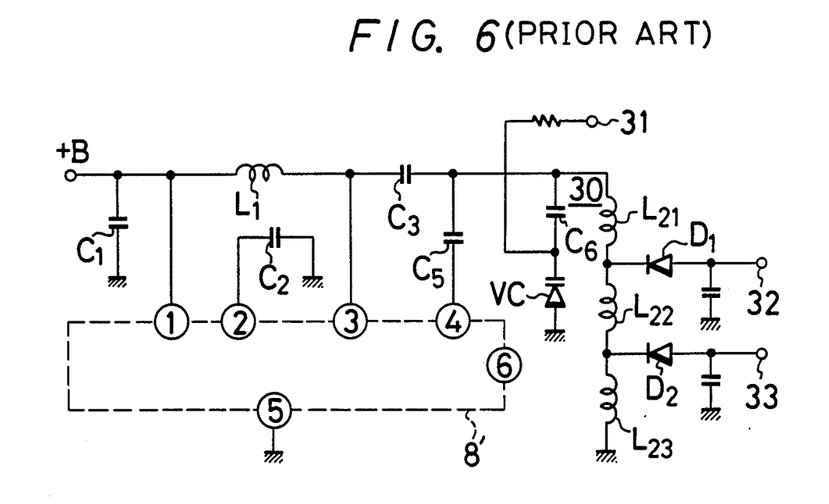

Referring now to FIG. 6, it will be seen that, in a known example of a practical three-band change-over local oscillator circuit of a tuner, resonance winding $L_2$ in FIG. 5 is replaced by a series connection of three windings $L_{21}$, $L_{22}$, and $L_{23}$, and band selection signals are supplied through terminals 32 and 33 to diodes $D_1$ and $D_2$, respectively, to switch the same and thereby select a band from among a VHF low channel, a VHF high channel, and a CATV channel (230–470 MHz).

Incidentally, it is usual for the above-mentioned oscillation feedback loop comprising of capacitors $C_3$ and $C_5$ to be grounded through the resonance circuit 30 or 30' in the local oscillator circuit of a tuner, as shown, for example, in FIG. 5.

It will be appreciated that the transistors in an IC which is used to provide such a high frequency oscillation are formed with very fine patterns due to the smallness of such electronic parts, so that they are easily destroyed by noise, for example, by static electricity which enters the IC through one of the terminals thereof. In order to prevent damage to or destruction of the transistors or other elements of the IC 8', the latter is further provided internally with protective diodes for each of the electrodes in the IC, as shown in FIG. 4. To be specific, as shown in FIG. 4, a series circuit of diodes $D_3$ and $D_4$ and a series circuit of diodes $D_5$ and $D_6$ are connected between the power source line to which is connected pin 1 of IC 8' and the grounded line to which is connected pin 5. The junction point between diodes $D_3$ and $D_4$ and the junction point between diodes $D_5$ and $D_6$ are respectively connected to the base of oscillation transistor $Q_1$ and the base of feedback transistor $Q_2$. Further, a protective diode $D_7$ is also connected between the collector of transistor $Q_1$ and the grounded line.

It is mainly due to these protective diodes $D_3$–$D_7$ that an integrated oscillator circuit can more easily fall into an unstable condition as compared with a discrete oscillator circuit. More specifically, even when the diodes are in their off-state, the junction capacitance thereof is so large that a great deal of electric power is consumed by the diodes in a high frequency range; and the junction capacitance of each diode substantially varies with changes in temperature so that the IC parameters also vary.

These characteristics of the diodes can cause the oscillation to stop and can increase drift at starting and drift caused by changes in temperature. In order to stably operate the integrated oscillator circuit 8' even at a high frequency, it is necessary to remove the bad influence of the protective diodes on the oscillator circuit.

Figure 7:
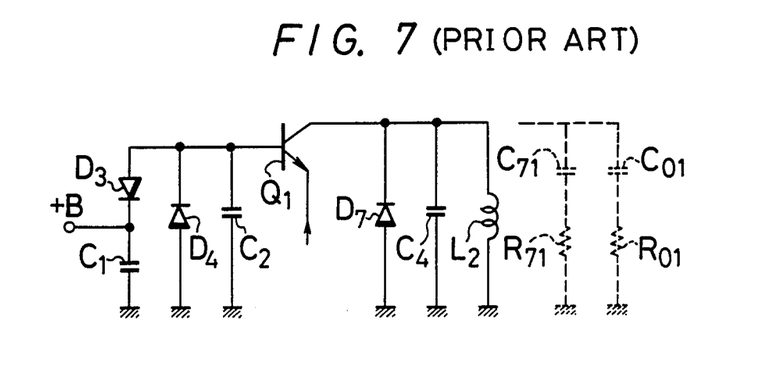
FIG. 7 is an equivalent circuit diagram to which reference will be made in explaining a problem encountered with the oscillator circuit shown in FIG. 4.

The integrated oscillator circuit of FIG. 4 is redrawn on FIG. 7 to show the operational principle thereof particularly with respect to the protective diode $D_7$. As is clear from FIG. 7, protective diode $D_7$ is connected in parallel to the oscillator or resonance circuit 30 formed of capacitor $C_4$ and winding $L_2$, both of which are selected to determine the oscillation frequency. Therefore, the resonance circuit is directly and substantially affected by diode $D_7$.

The diode $D_7$ can be equivalently replaced by a series circuit of a capacitor $C_{71}$ and a resistor $R_{71}$, as shown in broken lines in FIG. 7. The resistor $R_{71}$ largely damps the high frequency components and thereby impedes the oscillation. Further, in addition to the diode $D_7$, it can be supposed that there is connected, in parallel to the resonance circuit 30, a series circuit of a stray capacitor $C_{01}$ and a stray resistor $R_{01}$ of the IC 8', also shown in broken lines in FIG. 7, and which also impedes the oscillation.

If an IC having a double-balanced mixer, a local oscillator, and an IF amplifier integrated therein can be stably operated with a received frequency of 470 MHz and a local oscillation frequency above 510 MHz, the following advantages can be obtained:

1. The double-balanced mixer can provide its advantages over the entire CATV band; and 2. Since the local oscillator circuit is in the form of an IC, the number of necessary electronic parts is decreased to thereby reduce the production cost.

To provide an integrated local oscillator circuit stably generating an oscillation frequency above 510 MHz requires the following:

1. The oscillation frequency is not varied much by heat generated in the IC after the power source switch is turned on;

2. The oscillation frequency is not varied much by variations in the ambient temperature around the IC; and 3. Oscillation of the local oscillator circuit is not easily stopped by a drop in the power source voltage.

However, with the prior art circuits it has been difficult to even oscillate the local oscillator at frequencies above 510 MHz.

OBJECT AND SUMMARY OF THE INVENTION

Accordingly, it is an object of the invention to provide, in a simple manner, a three-band change-over integrated local oscillator circuit which is capable of stably oscillating at frequencies above 510 MHz.

In accordance with an aspect of the invention, an integrated voltage controllable oscillator comprises a transistor for oscillation arranged in the integrated circuit, a resonance circuit externally connected to two electrodes of the transistor, a variable capacitance element adapted to vary a resonance frequency of the resonance circuit, and a high impedance element connected between the variable capacitance element and the ground in a circuit adapted to supply a control voltage to the variable capacitance element.

The preceding and other objects, features and advantages of the invention will become apparent from the following detailed description of preferred embodiments which is to be read in conjunction with the accompanying drawings, throughout which the same reference numerals designate corresponding elements and parts.

DESCRIPTION OF THE PREFERRED EMBODIMENTS

A first embodiment of the invention will now be described in detail with reference to FIG. 8 which shows a variable frequency oscillator circuit without band change-over function, and in which parts corresponding to those described with reference to FIGS. 4 and 5 are identified by the same reference numerals.

Figure 8:
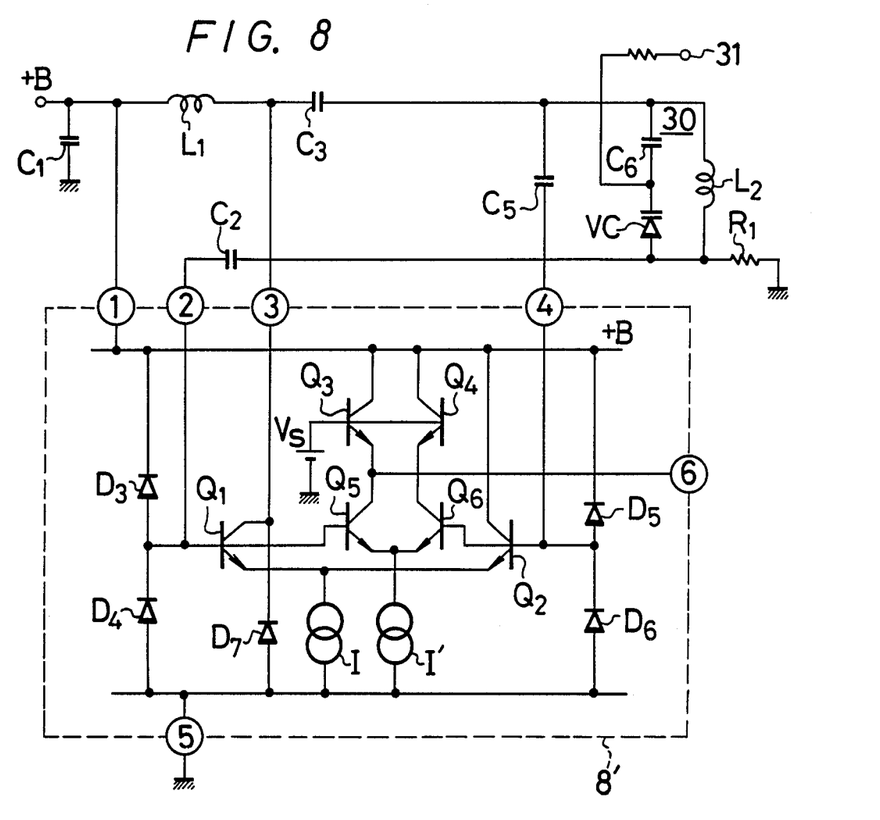
FIG. 8 is a circuit diagram showing an integrated variable frequency oscillator circuit according to an embodiment of the present invention.

In the example shown in FIG. 8, there is provided a parallel resonance circuit 30 comprising a variable capacitance diode VC, a capacitor $C_6$, and a winding $L_2$. The junction point between capacitor $C_6$ and winding $L_2$ is connected, through a capacitor $C_3$ for blocking direct current components, to pin 3 of IC 8', that is, to the collector of transistor $Q_1$ for oscillation, and the junction point between variable capacitance diode VC and winding $L_2$ is connected, through a capacitor $C_2$ for blocking direct current components, to pin 2 of IC 8', that is, to the base of transistor $Q_1$ for oscillation. A control signal is supplied from terminal 31 to the cathode side of variable capacitance diode VC, while the anode side of the latter is grounded through a resistor $R_1$. The resistor $R_1$ thus included in a circuit adapted to supply the variable capacitance diode VC with the control signal has a large resistance value, for example, about 10K $\Omega$. This resistor $R_1$ may be replaced by a choke winding having a high impedance.

Figure 9:
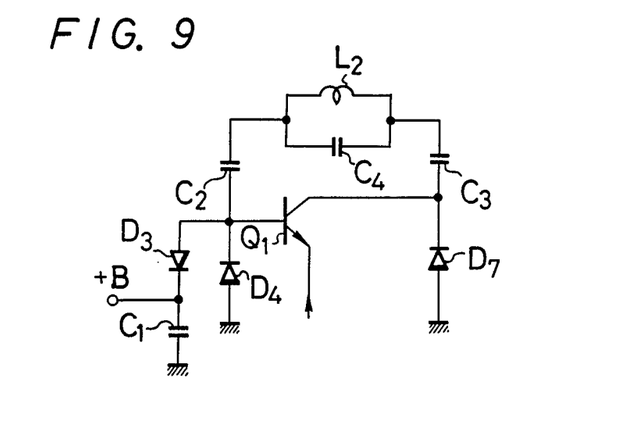
FIG. 9 is an equivalent circuit diagram to which reference will be made in explaining an operational advantage of the oscillator circuit according to the invention.

FIG. 9 is an equivalent circuit diagram corresponding to a fixed frequency oscillator circuit according to the invention, and to which reference will be made in explaining how the invention prevents the oscillator circuit from being badly influenced by protective diodes integrated in the IC 8'. In other words, FIG. 9 corresponds to the application of the invention to a fixed frequency oscillator comprising the IC 8' and the external elements shown on FIG. 4. In such case, the parallel resonance circuit, which is formed of capacitor $C_4$ and winding $L_2$, is not grounded, but rather is directly connected between the base (pin 2 of IC 8') and the collector (pin 3 of IC 8') of transistor $Q_1$ through the capacitors $C_2$ and $C_3$ (which serve to block direct current components on this occasion). With such arrangement according to the invention, the protective diode $D_7$ is separated from resonance circuit 30 to thereby largely reduce the bad influence of the diode $D_7$ on the resonance circuit.

Although in the case illustrated by FIG. 9, the diode $D_7$ is connected in parallel to the resonance circuit 30 through diode $D_3$ or $D_4$, the efficiency of diode $D_7$ is diminished by the fact that diodes $D_3$ and $D_4$ are connected in series and the resonance circuit 30 is directly connected between the base and collector of transistor $Q_1$. Accordingly, the bad influence of diode $D_7$ on the oscillator circuit is again largely reduced.

Thus, in the above described manner, an oscillator circuit according to the invention can stably oscillate even at high frequencies.

Figure 10:
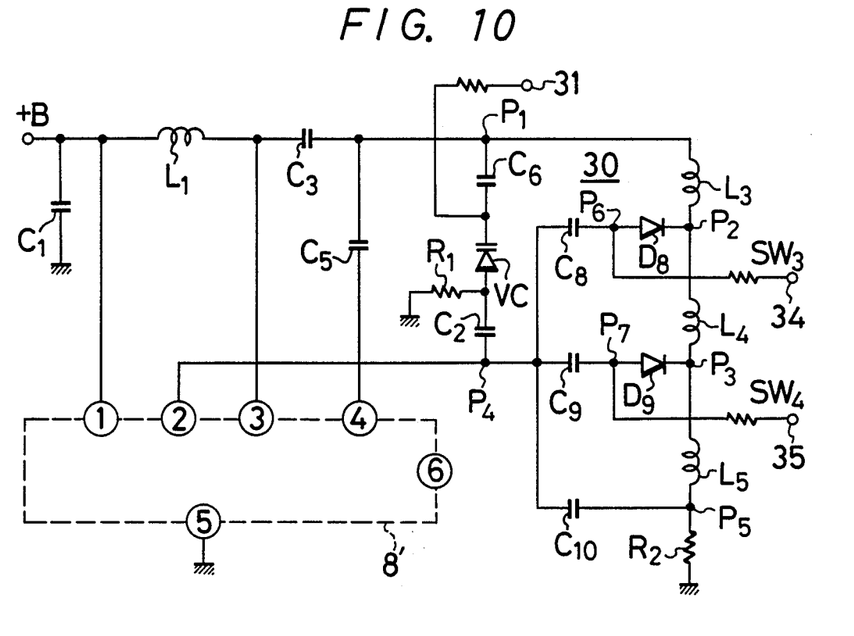
FIGS. 10 and 11 are circuit diagrams showing oscillator circuits according to second and third embodiments of the invention, respectively.

FIG. 10 is a circuit diagram showing a second embodiment of the invention wherein a three-band change-over function is effected.

In FIG. 10, the single winding $L_2$ of the resonance circuit in FIG. 8 is replaced by three windings $L_3$, $L_4$ and $L_5$. The junction point $P_1$ between capacitors $C_3$ and $C_6$ is grounded through a series connection of the windings $L_3$, $L_4$ and $L_5$ and a resistor $R_2$. A series circuit of a capacitor $C_8$ and a diode $D_8$ is connected between the junction point $P_2$ between windings $L_3$ and $L_4$ and a junction point $P_4$ between capacitor $C_2$ and pin 2. Also, in the same manner, a series circuit of a capacitor $C_9$ and a diode $D_9$ is connected between junction point $P_4$ and a junction point $P_3$ between windings $L_4$ and $L_5$. Further, a capacitor $C_{10}$ is connected between junction point $P_4$ and a junction point $P_5$ between winding $L_5$ and resistor $R_2$.

A band selection signal $SW_3$ for turning ON and OFF diode $D_8$ is supplied from a terminal 34 to a junction point $P_6$ between diode $D_8$ and capacitor $C_8$. Another band selection signal $SW_4$ for turning ON and OFF diode $D_9$ is supplied from a terminal 35 to a junction point $P_7$ between diode $D_9$ and capacitor $C_9$.

The resistor $R_2$ is required to have a large resistance, for example, of at least 3K $\Omega$. The manner in which one of the three bands is selected by the use of the band selection signals $SW_3$ and $SW_4$ will now be described.

The connection condition of the three windings $L_3$, $L_4$ and $L_5$ between the junction point $P_1$ of the capacitor $C_6$ with the capacitor $C_3$ and the junction point $P_4$ of the capacitor $C_2$ with the pin 2 is changed in response to the band selection signals. To be specific, let be assumed first that the band selection signals $SW_3$ and $SW_4$ are both at a low level or "0". In that case, diodes $D_8$ and $D_9$ are both in the OFF-state, and, therefore, the three windings $L_3$, $L_4$ and $L_5$ are connected in series between junction points $P_1$ and $P_4$ so that the lowest of the three bands is selected.

If the band selection signals $SW_3$ and $SW_4$ are both at a high level or "1", diodes $D_8$ and $D_9$ are changed-over to their ON-state so that the three windings $L_3$, $L_4$ and $L_5$ are connected in such a manner that the highest band is selected.

If the band selection signal $SW_3$ is at low level or "0" while signal $SW_4$ is at high level or "1", the diode $D_8$ is in its OFF-state while the diode $D_9$ is in its ON-state. As a result, the windings $L_3$, $L_4$ and $L_5$ are connected in such a manner that an intermediate band is selected.

With the embodiment shown in FIG. 10, it is possible to obtain an integrated oscillator circuit which can stably oscillate at frequencies over a wide frequency band. For example, a CATV tuner for use in West Germany requires a range of the local oscillation frequency from 87 MHz to 510 MHz, and that range is easily available with the embodiment of FIG. 10.

Moreover, integrated oscillator circuits according to the present invention can largely reduce the drift due to changes in ambient temperature and drift due to the rise in temperature at starting after the power source switch is turned on, so that they can be put to practical use in CATV tuners.

Figure 11:
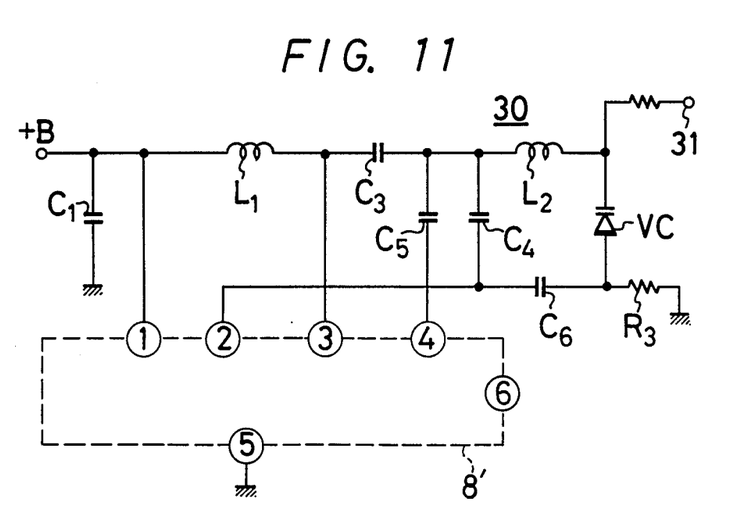

FIG. 11 shows an embodiment of the invention in which the integrated oscillator circuit is employed to generate variable frequencies in a UHF band.

In FIG. 11, a resistor $R_3$, connected between the anode side of the variable capacitance diode VC and the ground, and which serves to supply electric power to the variable capacitance diode VC, should have a large resistance value, for example, about 10K $\Omega$. However, it has been determined experimentally that good characteristics can be obtained when the resistance value of resistor $R_3$ is at least 3K $\Omega$.

It has also been determined experimentally that the oscillator circuit shown in FIG. 11 can generate frequencies over a frequency band from 500 MHz to 850 MHz.

As set forth above, integrated oscillator circuits according to the invention can stably generate high frequencies, so that the maximum oscillating frequency thereof is substantially increased. Further, drift due to changes in ambient temperature and drift at starting can be greatly reduced.

Therefore, when an integrated oscillator circuit according to the invention is applied to a CATV tuner, it is not necessary to separately provide a discrete local oscillator circuit just for a high frequency band, for example, as in the prior art shown in FIG. 2, so that the number of electronic parts necessary for constructing an oscillator circuit capable of generating high frequencies is thereby reduced.

Although illustrative embodiments of the invention have been described in detail herein with reference to the accompanying drawings, it will be apparent that the invention is not limited to those precise embodiments, and that many modifications and variations could be effected therein by one skilled in the art without departing from the spirit or scope of the invention as defined by the appended claims.

What is claimed is:

1. An integrated voltage controllable oscillator comprising: an integrated circuit including a transistor for oscillation having an emitter, a collector and a base connected to respective pins on said integrated circuit; a protective diode connected between said collector and ground; resonance circuit means externally connected to said collector and said base by way of said respective pins for oscillation; variable capacitance means for varying a resonance frequency of said resonance circuit means; and high impedance means connecting said resonance circuit means and said variable capacitance means to ground in a circuit for supplying a control voltage to said variable capacitance means, thereby reducing the influence of said protective diode on the operation of said resonance circuit means.

2. An integrated voltage controllable oscillator according to claim 1; in which said high impedance means includes a resistor.

3. An integrated voltage controllable oscillator according to claim 1; in which said high impedance means includes a choke winding.

4. An integrated voltage controllable oscillator according to claim 1; in which said resonance circuit means includes resonance winding means connected in a parallel circuit with resonance capacitance means, said resonance capacitance means being in series with said variable capacitance means.

5. An integrated voltage controllable oscillator according to claim 4; further comprising respective capacitors connecting said parallel circuit to said collector and said base for blocking direct current components.

6. An integrated voltage controllable oscillator according to claim 5; in which said variable capacitance means includes a variable capacitance diode having a cathode side to which said control voltage is applied and an anode side, and said high impedance means is connected between said anode side and ground.

7. An integrated voltage controllable oscillator according to claim 4; in which said resonance winding means includes a plurality of windings and circuit means responsive to band selection signals for connecting said plurality of windings in different configurations for selecting different respective frequency bands for the controllable oscillator.

* * * * *